US010938328B2

(12) United States Patent
Sellinger et al.

(10) Patent No.: US 10,938,328 B2
(45) Date of Patent: Mar. 2, 2021

(54) HARVESTING ENERGY FROM COMPOSITE AIRCRAFT ENGINE COMPONENTS

(71) Applicant: General Electric Company, Schenectady, NY (US)

(72) Inventors: Aaron Todd Sellinger, Cincinnati, OH (US); Nicholas Joseph Kray, Mason, OH (US)

(73) Assignee: General Electric Company, Schenectady, NY (US)

( * ) Notice: Subject to any disclaimer, the term of this patent is extended or adjusted under 35 U.S.C. 154(b) by 1121 days.

(21) Appl. No.: 15/189,026

(22) Filed: Jun. 22, 2016

(65) Prior Publication Data

US 2017/0373612 A1    Dec. 28, 2017

(51) Int. Cl.
*H02N 2/18*      (2006.01)
*H01L 41/113*      (2006.01)
(Continued)

(52) U.S. Cl.
CPC ........... *H02N 2/186* (2013.01); *C04B 35/117* (2013.01); *C04B 35/52* (2013.01); *C04B 35/565* (2013.01); *C04B 35/80* (2013.01); *F01D 5/16* (2013.01); *F01D 5/282* (2013.01); *F01D 15/10* (2013.01); *F01D 25/005* (2013.01); *F03G 7/08* (2013.01); *F04D 29/388* (2013.01); *G01K 7/02* (2013.01); *G01L 1/16* (2013.01); *H01L 35/32* (2013.01); *H02N 2/181* (2013.01); *C04B 2235/3217* (2013.01); *C04B 2235/3225* (2013.01); *C04B 2235/3244* (2013.01); *C04B 2235/349* (2013.01); *C04B 2235/3418* (2013.01); *C04B 2235/5224* (2013.01); *C04B 2235/5228* (2013.01); *C04B 2235/5244* (2013.01); *F01D 5/10* (2013.01);

*F01D 5/26* (2013.01); *F01D 25/04* (2013.01); *F01D 25/06* (2013.01); *F05D 2260/407* (2013.01); *F05D 2300/6033* (2013.01); *H01L 41/113* (2013.01); *Y02T 50/672* (2013.01); *Y02T 50/673* (2013.01)

(58) Field of Classification Search
CPC ............... H01L 41/113; H01L 41/1132; H01L 41/1134; H01L 41/1136; H01L 41/1138; H02N 2/18
USPC ....................................................... 310/339
See application file for complete search history.

(56) References Cited

U.S. PATENT DOCUMENTS 6,994,762 B2    2/2006   Clingman
6,995,496 B1 *   2/2006   Hagood, IV ........... H02N 2/181
                                                                               310/316.01

(Continued)

FOREIGN PATENT DOCUMENTS

EP      2 816 200 A1    12/2014
EP      2 868 896 A1    5/2015
(Continued)

OTHER PUBLICATIONS

International Search Report and Written Opinion issued in connection with corresponding PCT Application No. PCT/US2017/038754 dated Jan. 22, 2018.

*Primary Examiner* — Derek J Rosenau
(74) *Attorney, Agent, or Firm* — Dority & Manning, P.A.

(57) ABSTRACT

The present disclosure is directed to an engine component for a gas turbine engine, the engine component including a substrate that includes a composite fiber and defines a surface. An energy harvesting fiber is positioned within the substrate.

20 Claims, 9 Drawing Sheets

(51) Int. Cl.

| | | |
|---|---|---|
| *F04D 29/38* | (2006.01) |
| *H01L 35/32* | (2006.01) |
| *G01L 1/16* | (2006.01) |
| *G01K 7/02* | (2021.01) |
| *F01D 5/28* | (2006.01) |
| *F01D 15/10* | (2006.01) |
| *F01D 5/16* | (2006.01) |
| *C04B 35/52* | (2006.01) |
| *C04B 35/117* | (2006.01) |
| *F03G 7/08* | (2006.01) |
| *C04B 35/565* | (2006.01) |
| *F01D 25/00* | (2006.01) |
| *C04B 35/80* | (2006.01) |
| *F01D 25/04* | (2006.01) |
| *F01D 5/10* | (2006.01) |
| *F01D 25/06* | (2006.01) |
| *F01D 5/26* | (2006.01) |

(56) References Cited

U.S. PATENT DOCUMENTS

| | | |
|---|---|---|
| 7,368,827 B2 | 5/2008 | Kulkarni |
| 7,459,837 B2 | 12/2008 | Clingman |
| 7,541,720 B2 | 6/2009 | Clingman |
| 7,618,712 B2 | 11/2009 | Sabol |
| 7,860,664 B2 | 12/2010 | Loomis |
| 7,870,778 B2 | 1/2011 | Mitchell |
| 8,026,857 B2 | 9/2011 | Bommer |
| 8,143,766 B2 | 3/2012 | Namuduri |
| 8,487,177 B2 | 7/2013 | Pingree |
| 8,570,152 B2 | 10/2013 | Fahley |
| 8,835,743 B2 | 9/2014 | Pingree |
| 9,024,510 B1 | 5/2015 | Chen |
| 2004/0211250 A1* | 10/2004 | Adamson ............ B60C 23/0411 73/146 |
| 2005/0012434 A1* | 1/2005 | Pizzochero ........... H01L 41/113 310/339 |
| 2005/0284147 A1* | 12/2005 | Allen ...................... B64B 1/14 60/641.8 |
| 2007/0257634 A1* | 11/2007 | Leschin ................ H01L 41/113 320/107 |
| 2008/0054645 A1* | 3/2008 | Kulkarni ................ F01D 15/10 290/52 |
| 2009/0047453 A1* | 2/2009 | Folaron .................. B32B 37/18 428/34.1 |
| 2012/0133247 A1* | 5/2012 | Lee ......................... H01L 41/37 310/339 |
| 2014/0314567 A1 | 10/2014 | Morrison |
| 2015/0061375 A1 | 3/2015 | von Heimendahl |
| 2015/0086368 A1* | 3/2015 | Shekher ................. F03D 3/005 416/146 R |
| 2015/0268090 A1 | 9/2015 | Munger |
| 2015/0280102 A1* | 10/2015 | Tajitsu ..................... G01L 1/16 310/338 |
| 2015/0364667 A1 | 12/2015 | Jarmon |
| 2018/0202512 A1* | 7/2018 | Koyama ................ G10K 11/16 |

FOREIGN PATENT DOCUMENTS

| | | |
|---|---|---|
| WO | 2007/038157 A2 | 4/2007 |
| WO | 2011/050294 A2 | 4/2011 |
| WO | 2013/191907 A1 | 12/2013 |

* cited by examiner

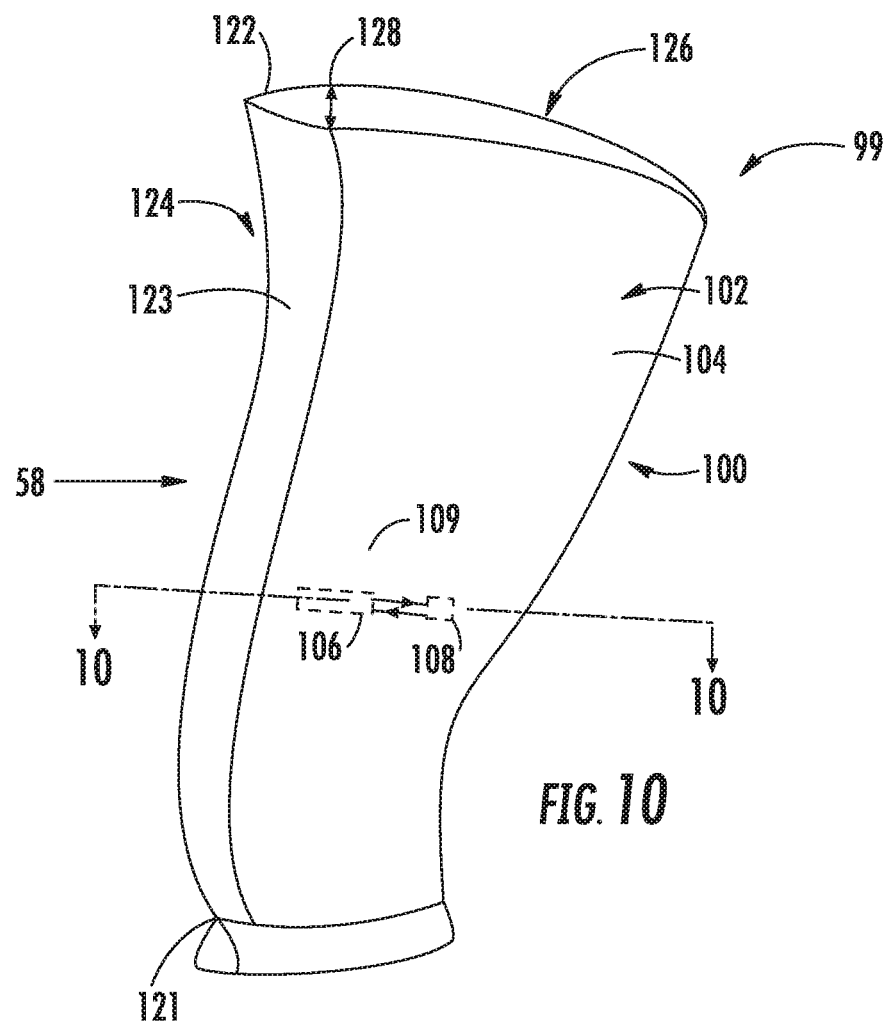
FIG. 10
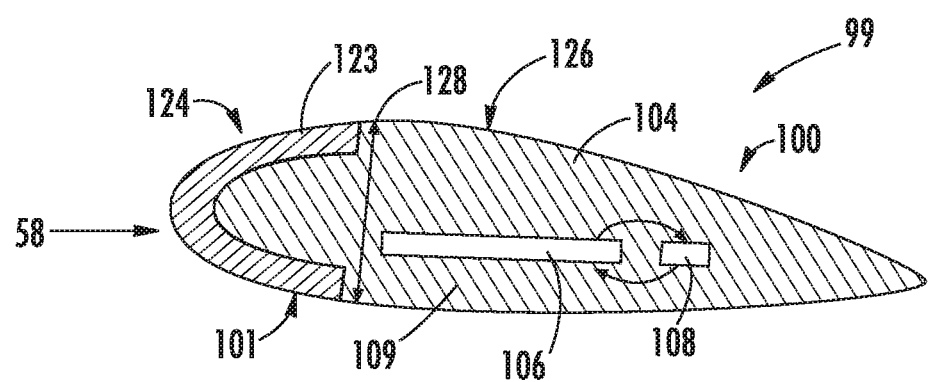
FIG. 11   SECT. B-B

HARVESTING ENERGY FROM COMPOSITE AIRCRAFT ENGINE COMPONENTS

FIELD OF THE INVENTION

The present subject matter relates generally to generating power from gas turbine engine waste energy. More specifically, the present subject matter relates to composite gas turbine engine components with integrated energy harvesting materials.

BACKGROUND OF THE INVENTION

Aircraft gas turbine engines deliver propulsive thrust for aircraft movement as well as provide power for ancillary aircraft systems and sensors, engine sensors, and engine performance enhancements. These sensors may be used to monitor and communicate engine performance and health. Additionally, other systems may be used to extract power to influence engine component characteristics and operational behavior. Increasingly extensive real-time engine performance and health monitoring is being utilized to more accurately and precisely predict potential component failures. In doing so, engines may stay on-wing for longer durations, thereby reducing the amount of time an engine is off-wing and not generating revenue. As analytics becomes more pervasive in monitoring aircraft engines, the need for additional sensors and systems creates an additional need for providing power for these sensors and systems as well as packaging and routing these sensors to their power sources.

Conventionally, power to these sensors and systems is extracted from propulsive energy from an aircraft, such as through engine-mounted generators, aircraft-mounted fuel cells, or auxiliary power units. However, powering such sensors may adversely impact overall engine or aircraft performance, operability, fuel burn, and regulated emissions by increasing the load on a propulsion engine. The increased load on a propulsive engine may take the form of increased weight through added wiring harnesses from a sensor to an engine generator to an electronic engine control or prognostics unit. Therefore, a need exists to minimize the amount of energy taken, directly and indirectly, from propulsive thrust to power ancillary sensors and systems.

BRIEF DESCRIPTION OF THE INVENTION

Aspects and advantages of the invention will be set forth in part in the following description, or may be obvious from the description, or may be learned through practice of the invention.

The present disclosure is directed to an engine component for a gas turbine engine, the engine component including a substrate that includes a composite fiber and defines a surface. An energy harvesting fiber is positioned within the substrate.

In one exemplary embodiment of the present disclosure a method of harvesting energy from a gas turbine engine component is provided. The method includes integrating an energy harvesting fiber into a substrate of the engine component and electrically coupling the energy harvesting fiber to a load. The method also includes converting mechanical energy into electrical energy and supplying electrical energy to the load.

In another exemplary embodiment of the present disclosure a method of harvesting energy to absorb vibrations in a gas turbine engine component is provided. The method includes electrically coupling an energy harvesting fiber to a shunt transducer and tuning the shunt transducer to dampen the engine component to a non-resonant mode. The method also includes integrating the energy harvesting fiber and shunt transducer to the engine component, converting mechanical energy into electrical energy, and supplying electrical energy to the shunt transducer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 10 is a perspective view of another exemplary composite engine component and energy harvesting material;

FIG. 11 is a cross sectional view of the exemplary composite engine component shown in FIG. 10.

Figure 1:
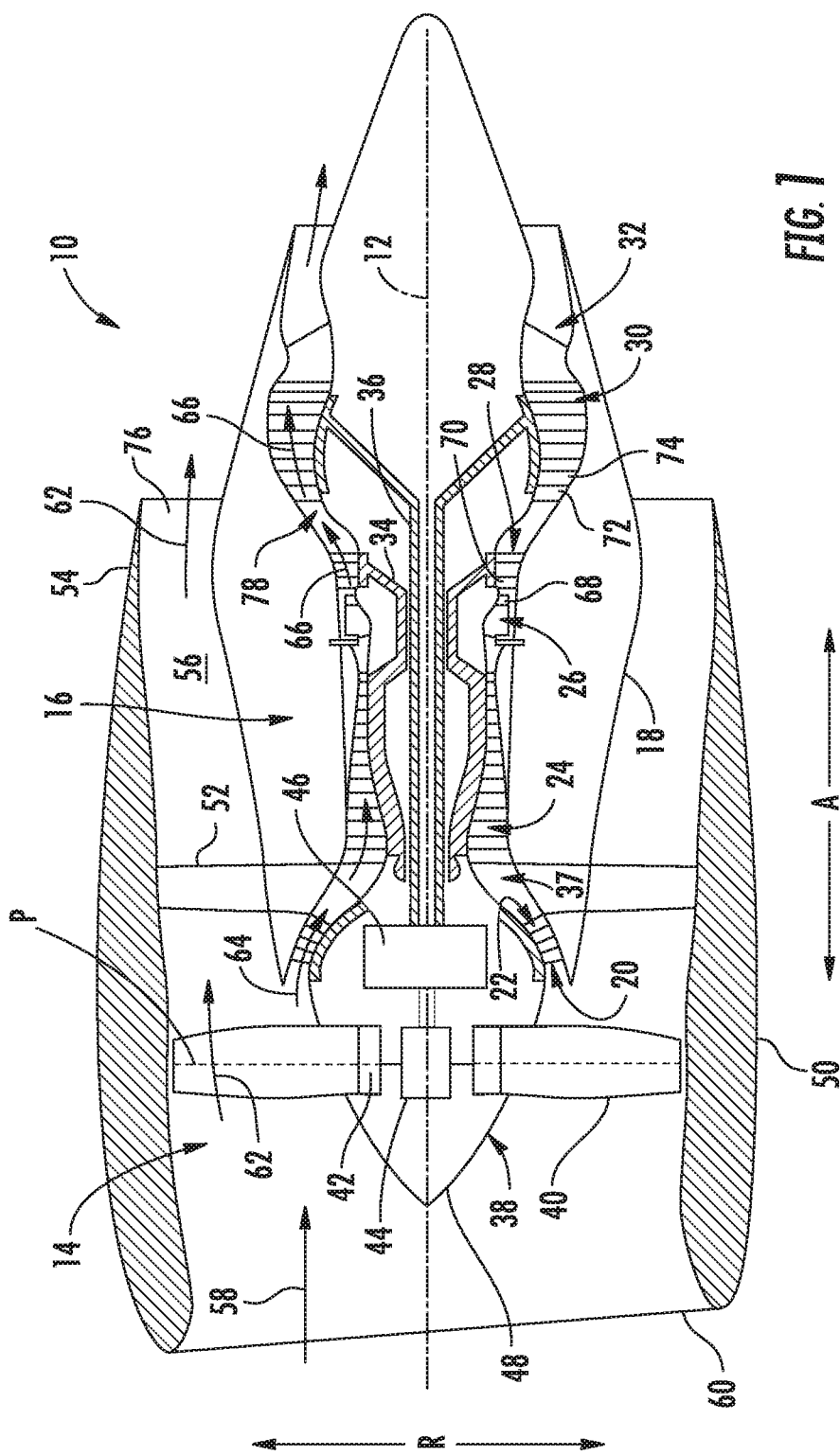
FIG. 1 is a schematic cross-sectional view of an exemplary high-bypass turbofan jet engine.

Repeat use of reference characters in the present specification and drawings is intended to represent the same or analogous features or elements of the present invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one component from another and are not intended to signify location or importance of the individual components.

The terms "upstream" and "downstream" refer to the relative direction with respect to fluid flow in a fluid pathway. For example, "upstream" refers to the direction from which the fluid flows, and "downstream" refers to the direction to which the fluid flows.

A gas turbine engine component with an energy harvesting fiber positioned on a composite substrate of the engine component is generally provided, along with its methods of manufacture and use. The use of energy harvesting fibers in or on a composite engine component can reduce the weight, complexity, and cost of sensors, systems, and measurement devices that otherwise require an external power source or extensive lead routing. Additionally, sensors, systems, and measurement devices powered by energy harvesting fibers that are positioned in or on engine components can improve sensor performance and mortality by reducing the amount of lead wires applied to an engine, reducing limits to sensor application location on engine components, and reducing limits to the quantity of sensors that can be applied to an engine. Energy harvesting fibers integrated positioned in the composite substrate of an engine component lessens the need to route lead wires from a sensing location to an external power source (e.g. battery or connection to an engine generator) or junction (e.g. relay panel, a patch panel, or slip ring interface). Powering sensors using energy harvesting fibers can enhance gas turbine engine performance through the increased collection of performance, health, and safety data by powering sensors using the waste energy of a gas turbine engine.

Furthermore, energy harvesting fibers that are integrated into the composite substrate of gas turbine engine components may be configured to act as a vibration dampener. This configuration may enhance gas turbine engine performance by controlling certain vibratory modes without changing certain engine component design features. For example, engine airfoil design is often a compromise between meeting structural performance requirements, including vibratory responses, weight limits, and foreign object damage considerations, versus an ideal aerodynamic airfoil design. Integrating energy harvesting fibers into a composite airfoil limits or eliminates these compromises in design by dampening certain vibratory modes without incorporating deleterious design features (e.g. thicker surfaces, heavier materials, or a combination thereof).

Although described below with reference to the turbofan engine 10, the present disclosure is applicable to all turbomachinery, including turboprops, turboshafts, turbojets, industrial and marine gas turbine engines, and auxiliary power units.

Referring now to the drawings, FIG. 1 is a schematic cross-sectional view of a gas turbine engine in accordance with an exemplary embodiment of the present disclosure. More particularly, for the embodiment of FIG. 1, the gas turbine engine is a high-bypass turbofan jet engine 10, referred to herein as "turbofan engine 10." As shown in FIG. 1, the turbofan engine 10 defines an axial direction A (extending parallel to a longitudinal centerline 12 provided for reference) and a radial direction R. In general, the turbofan 10 includes a fan section 14 and a core turbine engine 16 disposed downstream from the fan section 14.

The exemplary core turbine engine 16 depicted generally includes a substantially tubular outer casing 18 that defines an annular inlet 20. The outer casing 18 encases, in serial flow relationship, a compressor section 21 including a booster or low pressure (LP) compressor 22 and a high pressure (HP) compressor 24; a combustion section 26; a turbine section 31 including a high pressure (HP) turbine 28 and a low pressure (LP) turbine 30; and a jet exhaust nozzle section 32. A high pressure (HP) shaft or spool 34 drivingly connects the HP turbine 28 to the HP compressor 24. A low pressure (LP) shaft or spool 36 drivingly connects the LP turbine 30 to the LP compressor 22. The compressor section 21, combustion section 26, turbine section 31, and nozzle section 32 together define a core air flowpath 37.

For the embodiment depicted, the fan section 14 includes a variable pitch fan 38 having a plurality of fan blades 40 coupled to a disk 42 in a spaced apart manner. As depicted, the fan blades 40 extend outwardly from disk 42 generally along the radial direction R. Each fan blade 40 is rotatable relative to the disk 42 about a pitch axis P by virtue of the fan blades 40 being operatively coupled to a suitable actuation member 44 configured to collectively vary the pitch of the fan blades 40 in unison. The fan blades 40, disk 42, and actuation member 44 are together rotatable about the longitudinal axis 12 by LP shaft 36 across a power gearbox 46. The power gearbox 46 includes a plurality of gears for adjusting the rotational speed of the fan 38 relative to the LP shaft 36 to a more efficient rotational fan speed.

Referring still to the exemplary embodiment of FIG. 1, the disk 42 is covered by rotatable front hub 48 aerodynamically contoured to promote an airflow through the plurality of fan blades 40. Additionally, the exemplary fan section 14 includes an annular fan casing or outer nacelle 50 that circumferentially surrounds the fan 38 and/or at least a portion of the core turbine engine 16. It should be appreciated that the nacelle 50 may be configured to be supported relative to the core turbine engine 16 by a plurality of circumferentially-spaced outlet guide vanes 52. Moreover, a downstream section 54 of the nacelle 50 may extend over an outer portion of the core turbine engine 16 so as to define a bypass airflow passage 56 therebetween.

During operation of the turbofan engine 10, a volume of air 58 enters the turbofan 10 through an associated inlet 60 of the nacelle 50 and/or fan section 14. As the volume of air 58 passes across the fan blades 40, a first portion of the air 58 as indicated by arrows 62 is directed or routed into the bypass airflow passage 56 and a second portion of the air 58 as indicated by arrow 64 is directed or routed into the core air flowpath 37, or more specifically into the LP compressor 22. The ratio between the first portion of air 62 and the second portion of air 64 is commonly known as a bypass ratio. The pressure of the second portion of air 64 is then increased as it is routed through the high pressure (HP) compressor 24 and into the combustion section 26, where it is mixed with fuel and burned to provide combustion gases 66.

The combustion gases 66 are routed through the HP turbine 28 where a portion of thermal and/or kinetic energy from the combustion gases 66 is extracted via sequential stages of HP turbine stator vanes 68 that are coupled to the outer casing 18 and HP turbine rotor blades 70 that are coupled to the HP shaft or spool 34, thus causing the HP shaft or spool 34 to rotate, thereby supporting operation of the HP compressor 24. The combustion gases 66 are then routed through the LP turbine 30 where a second portion of thermal and kinetic energy is extracted from the combustion gases 66 via sequential stages of LP turbine stator vanes 72 that are coupled to the outer casing 18 and LP turbine rotor blades 74 that are coupled to the LP shaft or spool 36, thus causing the LP shaft or spool 36 to rotate, thereby supporting operation of the LP compressor 22 and/or rotation of the fan 38.

The combustion gases 66 are subsequently routed through the jet exhaust nozzle section 32 of the core turbine engine 16 to provide propulsive thrust. Simultaneously, the pressure of the first portion of air 62 is substantially increased as the first portion of air 62 is routed through the bypass airflow passage 56 before it is exhausted from a fan nozzle exhaust section 76 of the turbofan 10, also providing propulsive thrust. The HP turbine 28, the LP turbine 30, and the jet exhaust nozzle section 32 at least partially define a hot gas path 78 for routing the combustion gases 66 through the core turbine engine 16.

A turbofan engine 10 under normal operation will experience an amount of vibrations due to the rotation of the LP shaft 36 and the HP shaft 34, or due to the flow of fluids, such as air 58, through and within the engine 10. In another example, an engine 10 may experience abnormal amounts of vibrations due to a number of issues, including, though not limited to, unbalance in any member of a rotating structure; issues in the flow of oil through the engine 10, including loss of oil, contaminated oil, or defective oil flow and pressure; malfunctions in engine valves, including bleed valves, damper valves, pressure valves, or flow control valves; impending or present engine component liberation (e.g. broken or unfastened components); or issues due to combustion dynamics.

Figure 2:
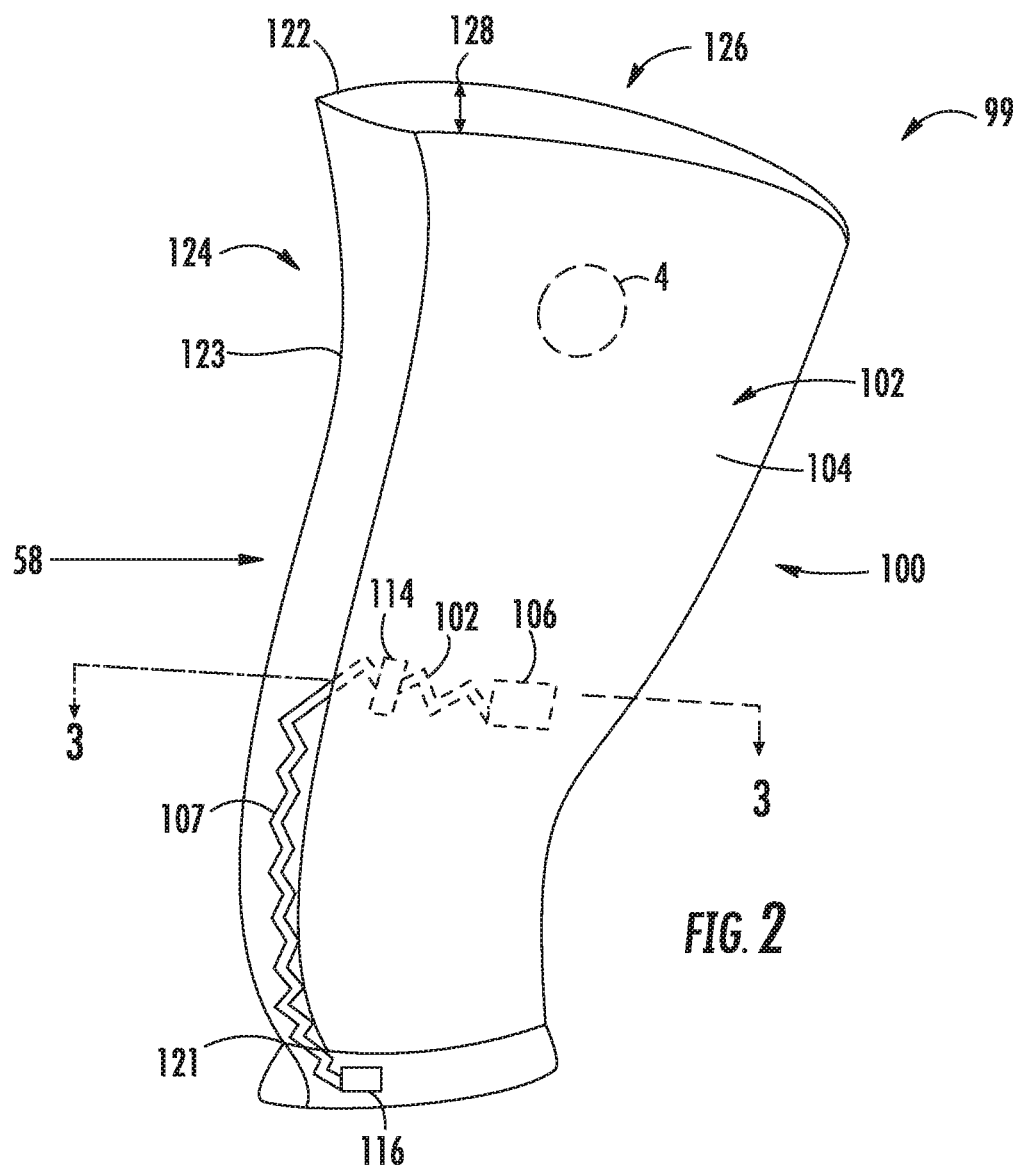
FIG. 2 is a perspective view of an exemplary composite engine component and energy harvesting material.
Figure 3:
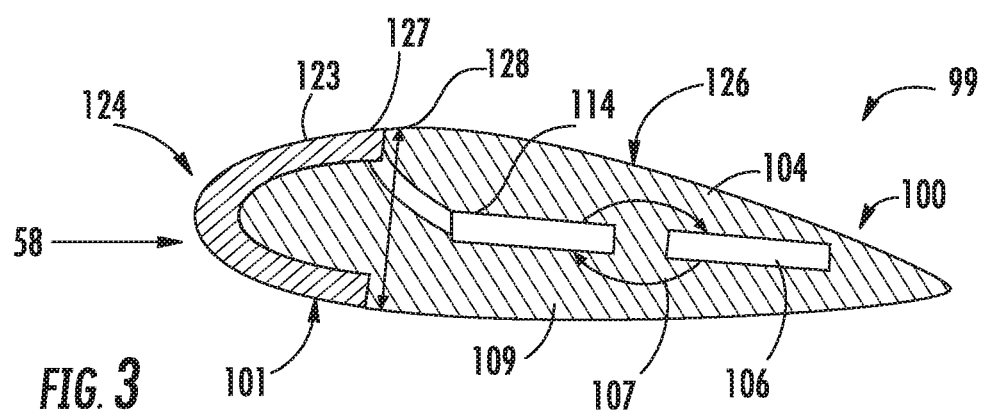
FIG. 3 is a cross sectional view of the exemplary composite engine component shown in FIG. 2.

FIG. 2 is an exemplary embodiment of an engine component 99 for a gas turbine engine 10 that includes an energy harvesting fiber 106 within a substrate 104 of the engine component 99. The substrate 104 defines a surface 102 that includes a composite fiber 134 (see FIGS. 4A and 4B). FIG. 3 is a cross sectional view of the exemplary embodiment of FIG. 2. The embodiment in FIG. 2 and FIG. 3 shows a configuration in which the energy harvesting fiber 106 is embedded in the substrate 104 of the engine component 99 defining an airfoil 100. The energy harvesting fiber 106 is electrically coupled to a sensor 114 within the substrate 104 of the engine component 99. Lead wires 107 egress from the sensor 114 to the surface 102 of the engine component 99 and are electrically coupled to a communicator 116. The energy harvesting fiber 106 supplies energy to the sensor 114 and the communicator 116. The sensors 114 include a plurality of types that are capable of measuring temperature, pressure, vibrations, clearance, flow rate, speed, tip-timing, stress, strain, gas sampling, debris detection, or other measurements pertinent in gas turbine engine design and operation. Although the embodiments shown in FIG. 2 and FIG. 3 of the engine component 99 define an airfoil 100, it should be appreciated that other forms and cross sections of engine components may be applied, such as casings, conduits, and structural members.

In one embodiment of the engine component 99 in FIG. 2 and FIG. 3, the energy harvesting fiber 106 is a piezoelectric fiber. Piezoelectric fibers are a form of energy harvesting fiber. Integrating piezoelectric fibers into composite engine components that experience considerable amounts of pressure change or vibration may provide power to sensors that can monitor and communicate the performance and structural health of engine components 99 on the engine 10. Piezoelectric materials are characterized by the piezoelectric effect, which is when an electric charge is generated in response to an applied mechanical stress. This may manifest in the force of air across an airfoil or within a case or the vibrations resulting from gas turbine engine operation. For instance, a piezoelectric transducer integrated in or on the substrate 104 of the airfoil 100 outputs a voltage that is directly proportional to the applied force, pressure, or strain induced on the airfoil 100. An output voltage may be compared to a known value for typical or safe operation of the engine 10 and airfoil 100. The compared value can then be set to a limit within a performance and health monitoring analytics regime associated with the engine 10.

A mechanical load 101, such as, but not limited to, vibrations, centrifugal force of the airfoil 100 rotation, air 58 across the airfoil 100, tooling strikes during assembly or maintenance, or foreign object ingestion (e.g. bird strikes, hail ingestion) can be used by the piezoelectric fiber to generate an electrical charge to the sensor 114 and the communicator 116. The sensor 114 may include an electrical signal from a pressure transducer, a thermocouple, a strain gage, an accelerometer, a proximity probe, a capacitive clearance probe, non-interference structural measurement system, flow meter, or other measurement device.

For example, the sensor 114 may be a strain gage or thermocouple that can provide structural health and safety data to the communicator 116. The communicator 116 may store or transmit the data from the sensor 114 to a full authority digital engine controller (FADEC) or to another data acquisition unit as part of a learning and development regime. The energy harvesting fiber 106 may be a piezoelectric fiber, in which energy from pressure changes or mechanical loads 101 is provided to power the sensor 114 and is also provided as data to be correlated to the strain gage measurements. In another embodiment, a thermoelectric fiber is used to convert temperatures and changes in the thermal gradient into energy for the sensor 114.

Figure 4A:
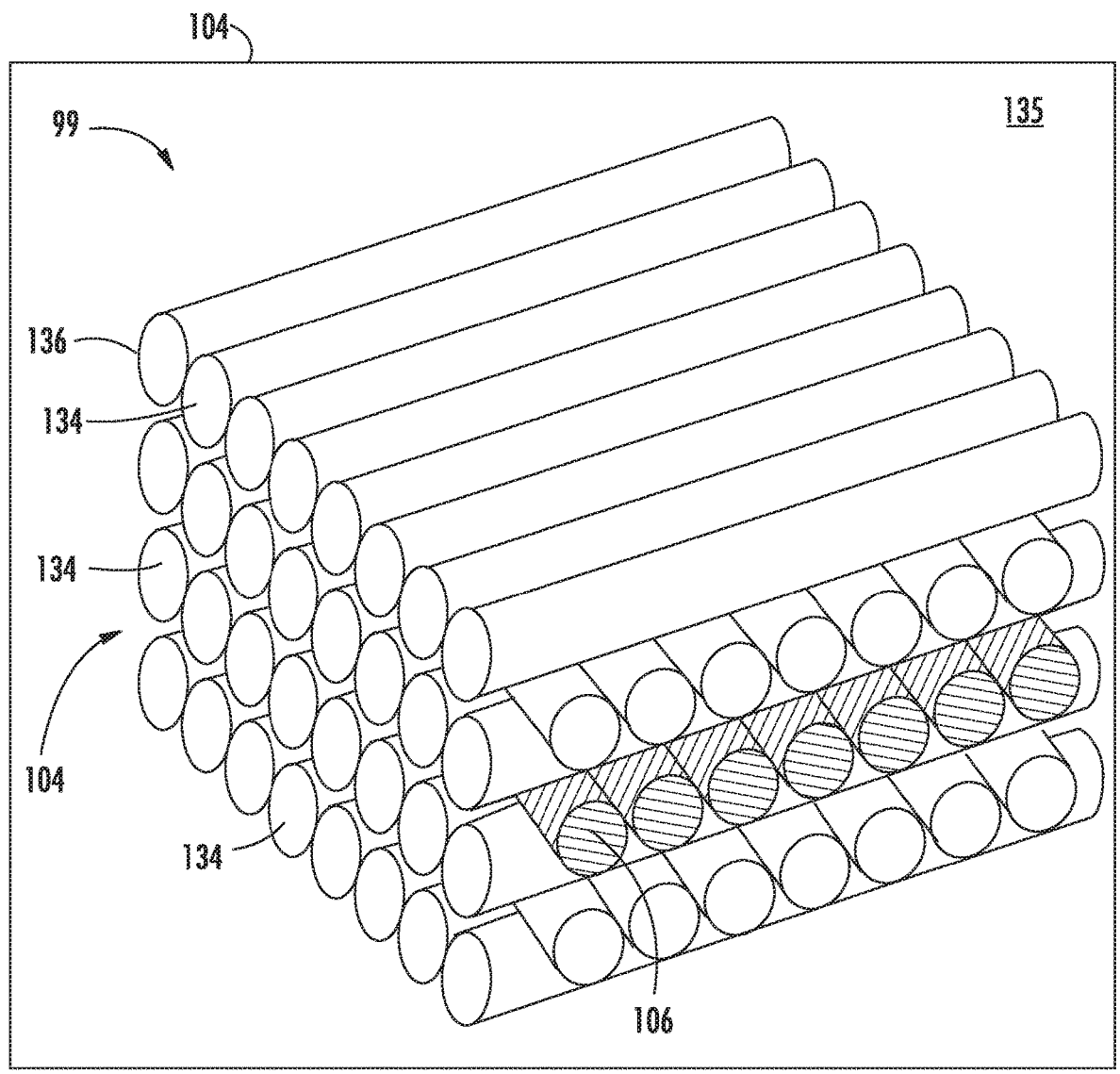
FIG. 4A is a perspective view of an exemplary embodiment of the composite structure of the exemplary engine component shown in FIG. 2.

FIG. 4A is a perspective view of the embodiment of the engine component 99 shown in FIG. 2 and FIG. 3, showing an exemplary embodiment of the substrate 104 formed by a plurality of layers 136 of composite fibers 134 with at least one layer 136 positioned therein that includes the energy harvesting fiber 106. Although the layer 136 as shown completely includes the energy harvesting fibers 106, the layer 136 can include a mixture of energy harvesting fibers 106 and composite fibers 134.

Figure 4B:
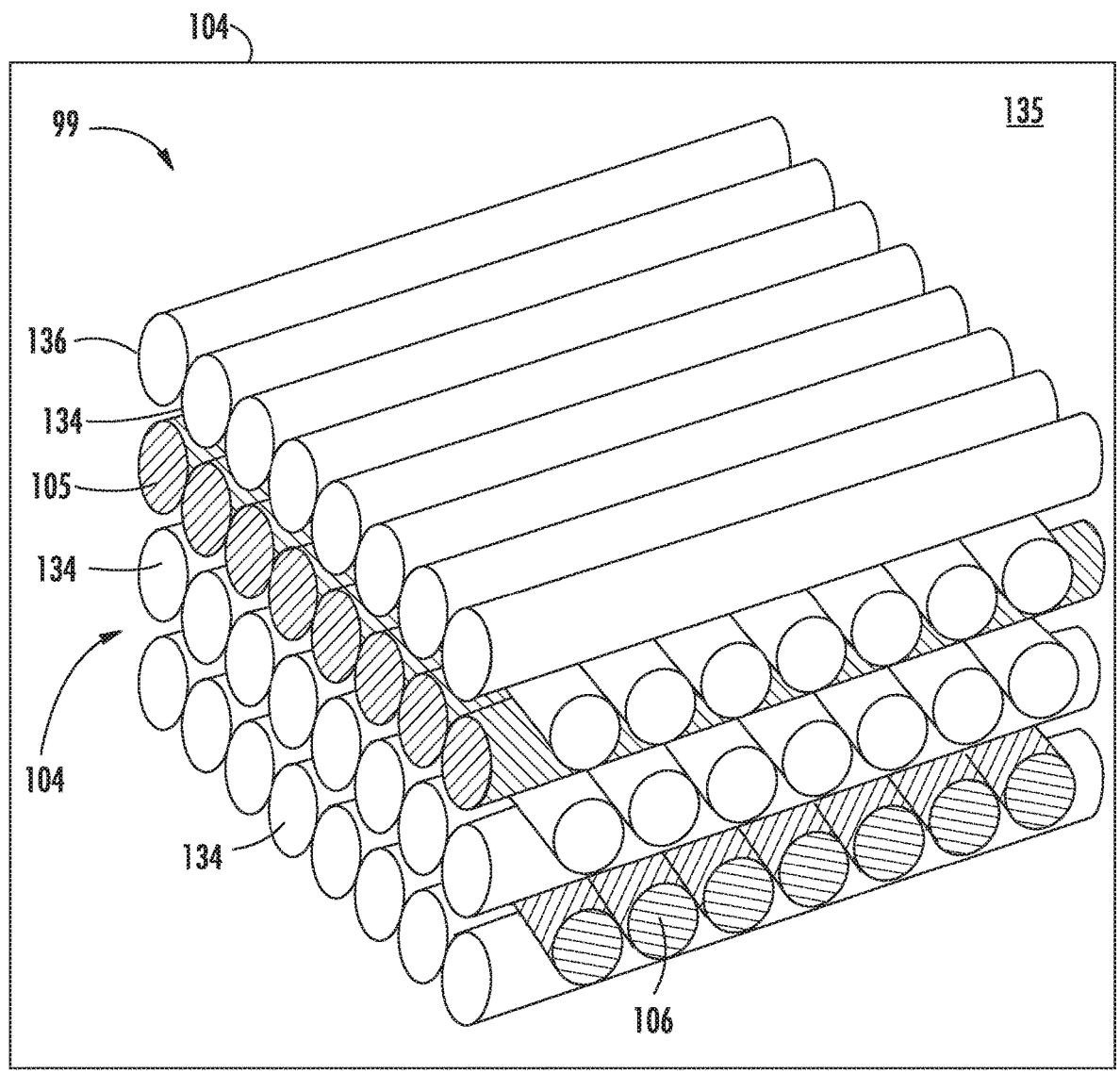
FIG. 4B is a perspective view of another exemplary embodiment of the composite structure of the exemplary engine component shown in FIG. 2.

FIG. 4B is a perspective view of the embodiment of the engine component 99 shown in FIG. 2 and FIG. 3, showing another exemplary embodiment of the substrate 104 formed by a plurality of layers 136 of composite fibers 134 with several layers 136 positioned therein including the energy harvesting fiber 106. In the embodiment shown in FIG. 4B, the energy harvesting fiber 106 and a second layer energy harvesting fiber 105 are separated by a plurality of layers 136 of composite fibers 134. The energy harvesting fiber 106 and the second layer energy harvesting fiber 105 define a perpendicular relationship to one another (i.e. the energy harvesting fiber 106 is rotated 90 degrees relative to the second layer energy harvesting fiber 105). However, in other embodiments, the energy harvesting fiber 106 and the second layer energy harvesting fiber 105 may define a parallel relationship to one another. In still other embodiments, the energy harvesting fiber 106 and the second layer energy harvesting fiber 105 define an oblique relationship (i.e. not parallel or perpendicular) in relation to one another. In yet other embodiments, either the energy harvesting fiber 106 or the second energy harvesting fiber 105 may define a perpendicular, parallel, or oblique relationship to the layers 136 of composite fibers 134. In still another embodiment, additional layers 136 of energy harvesting fiber 106 may be included in the substrate 104 (e.g. a third layer energy harvesting fiber, a fourth layer energy harvesting fiber, an Nth layer energy harvesting fiber, etc.). In still yet another embodiment, the energy harvesting fiber 106 and the second energy harvesting fiber 105, or any additional layers 136 of energy harvesting fiber 106, may be successively layered without a layer 136 of composite fibers 134 therebetween. Additionally, it should be appreciated that in the embodiments of the substrate 104 shown in FIGS. 4A and 4B, the composite fibers 134 may extend continuously throughout the entire substrate 104 of the engine component 99. However, in other embodiments the composite fibers 134 may extend throughout a portion of the substrate 104.

In one embodiment of the substrate 104 shown in FIG. 4A and FIG. 4B, the substrate 104 includes a matrix 135 and a composite fiber 134 that form a polymer matrix composite (PMC). Exemplary PMC materials utilized include a matrix 135 of a polymer-based material, which may include materials such as, but not limited to, a synthetic polymer, a polyepoxide, a polyurethane, or a polyester. In one embodiment, the synthetic polymer includes a solid foamed synthetic polymer containing a synthetic elastomer. In another embodiment, the synthetic elastomer is an elastomeric polyurethane. Fibers 134 embedded with the matrix 135 may include aromatic polyamide classes, or aramids, such as p-phenylene terephthalamides (PPTA) or para-aramids, or ultra-high molecular weight polyethylene, or metal, ceramic, glass, carbon, graphite, boron, nylon, aluminum oxide, or silicon carbide fibers, or mixtures thereof. The fibers 134 may include metallic strands, filaments, particles, whiskers, or fillers.

In another embodiment, the substrate 104 includes a matrix 135 and a composite fiber 134 that form a ceramic matrix composite (CMC). Exemplary CMC materials utilized may include silicon carbide, silicon, silica, carbon, or alumina matrix materials or combinations thereof. Ceramic fibers 134 may be embedded within the matrix 135, such as oxidation stable reinforcing fibers including monofilaments like sapphire and silicon carbide (e.g., Textron's SCS-6), as well as rovings and yarn including silicon carbide (e.g., Nippon Carbon's NICALON®, Ube Industries' TYRANNO®, and Dow Corning's SYLRAIVIIC®), alumina silicates (e.g., Nextel's 440 and 480), and chopped whiskers and fibers (e.g., Nextel's 440 and SAFFIL®), and optionally ceramic particles (e.g., oxides of Si, Al, Zr, Y and combinations thereof) and inorganic fillers (e.g., pyrophyllite, wollastonite, mica, talc, kyanite and montmorillonite).

In one embodiment of the substrate 104 shown in FIG. 4A and FIG. 4B, the matrix 135 and the composite fibers 134 are configured as a continuous fiber reinforced PMC or CMC material. For example, suitable continuous fiber reinforced materials may include, but are not limited to, PMC or CMC materials reinforced with continuous carbon fibers, oxide fibers, silicon carbide monofilament fibers and other PMC or CMC materials including continuous fiber lay-ups and/or woven fiber or fabric preforms. In other embodiments, the matrix 135 and the composite fibers 134 are configured as a discontinuous reinforced PMC or CMC material. For instance, suitable discontinuous reinforced PMC or CMC materials may include, but are not limited to, particulate, platelet, whisker, discontinuous fiber, in situ and nano-composite reinforced PMC or CMC materials. In yet other embodiments, the direction of the reinforcing fiber material may be biaxial, unidirectional, triaxial, or any other suitable direction or combination thereof.

In another embodiment, the substrate 104 made of a PMC or CMC material may be, e.g., layers 136 of composite fibers 134 pre-impregnated (pre-preg) with matrix material and may be formed from pre-preg tapes or the like. For example, the substrate 104 may be formed from a pre-preg tape including a desired ceramic or polymer fiber 134 reinforcement material, one or more precursors of the PMC or CMC matrix material, and organic resin binders. Pre-preg tapes are formed by impregnating the reinforcement material with a slurry that contains the ceramic or polymer precursor(s) and binders. The slurry may contain solvents for the binders that promote the fluidity of the slurry to enable impregnation of the fiber reinforcement material, as well as one or more particulate fillers intended to be present in the ceramic or polymer matrix 135 of the engine component 99, e.g., silicon and/or SiC powders in the case of a Si—SiC matrix. Preferred materials for the precursor will depend on the particular composition desired for the ceramic or polymer matrix 135 of the engine component 99. For example, the precursor material may be SiC powder and/or one or more carbon-containing materials if the desired matrix material is SiC. Carbon-containing materials include carbon black, phenolic resins, and furanic resins, including furfuryl alcohol ($C_4H_3OCH_2OH$).

In the exemplary embodiment of the engine component 99 defining the airfoil 100 in FIG. 2 and FIG. 3, the substrate 104 defining the surface 102 is formed of a plurality of layers 136 of composite fibers 134 with the energy harvesting fiber 106 positioned among the layers 136. The lead wires 107 are egressed appropriately to an edge or other egress point on the engine component 99. In the embodiment of the engine component 99, a sheath 123 is placed at the leading edge 124 of the substrate 104. The sheath 123 may be made of a PMC or CMC material or of a metal, such as, but not limited to, titanium, nickel, aluminum, or their alloys with other materials. The sheath 123 and the substrate 104 are formed together, such as, but not limited to, by mechanical pressing, applying an adhesive material, friction bonding, welding, brazing, or a combination of processes thereof. In other embodiments, the sheath 123 is excluded as a separate component and the engine component 99 is formed entirely by the substrate 104.

Figure 5:
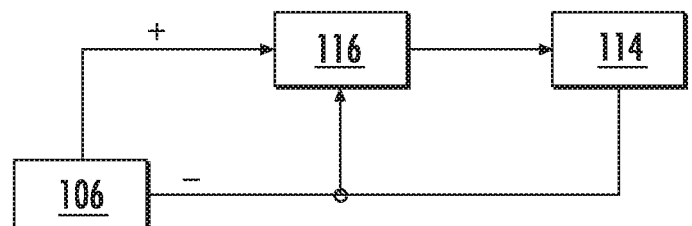
FIG. 5 is a block diagram of an exemplary engine component with an energy harvesting material.

FIG. 5 shows a block diagram of the energy harvesting fiber 106 electrically coupled to the communicator 116 and the sensor 114 in which the energy harvesting fiber 106 provides the input voltage to operate the communicator 116 and sensor 114. The communicator 116 includes a rectifier, a data storage device, and a wireless communicator, or a combination thereof. The data storage device includes a recording medium or a processor or both. The recording medium includes volatile (e.g. random access memory in semi-conductor processors) and non-volatile storage devices (e.g. hard drives or flash memory). The wireless communicator includes a transmitter or a transceiver that operates on the electromagnetic spectrum to communicate with a data acquisition unit. The communicator 116 provides an output voltage to the sensor 114 in which the sensor 114 requires an input voltage for operation, such as, but not limited to, proximity probes, non-interference structural measurement probes, or capacitance probes. The sensor 114 provides an analog output signal to the communicator 116 for communication to a data acquisition unit, or for recording on a data storage device, or both.

In one embodiment, the communicator 116 includes a rectifier, a volatile storage device, and a transmitter. For example, the sensor 114, such as a proximity probe, sends data in the form of an analog signal to the communicator 116, in which a volatile storage device is configured to send data to a transmitter for operatively immediate transfer to a receiver, such as a data acquisition unit. A data acquisition unit may generally refer to a computer or may refer to a plurality of electronics for controlling the engine 10 or aircraft, such as the FADEC.

In another embodiment, the communicator 116 includes a rectifier and a non-volatile storage device. The non-volatile storage device receives and stores data from a sensor 114. The stored data is retrieved at a later time, such as after operation of the engine 10.

In yet another embodiment, the communicator 116 includes a rectifier, a non-volatile storage device, and a transceiver. The non-volatile storage device receives and stores data from a sensor 114. The sensor 114 may include a transducer or other measurement device that takes a quantity of measurements within a period of time. The transceiver may be configured to the sensor 114 and the non-volatile storage to receive and store data on command through a signal received by the transceiver from the FADEC or another computing device.

Figure 6:
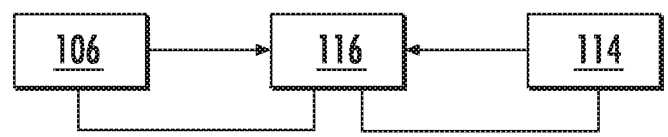
FIG. 6 is a block diagram of another exemplary engine component with an energy harvesting material.

The embodiment in FIG. 6 includes the energy harvesting fiber 106 electrically coupled to the communicator 116 and the sensor 114 in which the energy harvesting fiber 106 provides an input voltage to the communicator 116. In this embodiment, the sensor 114 is of a type that does not require an input voltage from the energy harvesting fiber 106. For example, the sensor 114 may be a thermocouple, a strain gage, a pressure sensor, or accelerometer. The sensor 114 is communicatively coupled to the communicator 116 as described with regard to FIG. 5 and various embodiments described herein.

The embodiments in either FIG. 5 or FIG. 6 or other various embodiments described herein can transmit data from the engine component 99 for use in monitoring the performance, health, and safety of the engine 10. The energy harvesting fiber 106 within the substrate 104 of the engine component 99 may reduce the weight and complexity of the engine 10 by removing the need to route lead wires 107 from a plurality of sensors 114 across and throughout the engine 10 to a common junction where an external power supply or communicator is located. Furthermore, as the power output or the number of terminals on a power supply is limited, powering the sensors 114 and the communicators 116 by the energy harvesting fiber 106 within the substrate of the engine component 99 enables larger quantities of the sensors 114 and the communicators 116 to be placed in or on an engine 10. Applying larger quantities of sensors 114 to the engine 10 while reducing the complexity and weight of applying the sensors 114 enables additional structural health and safety monitoring while minimizing deleterious effects to engine performance and operability.

Figure 7:
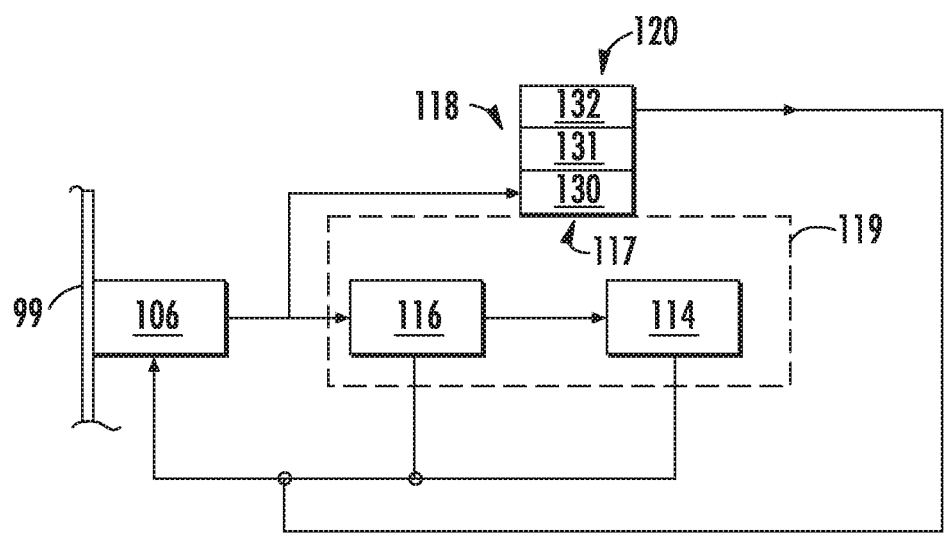
FIG. 7 is the block diagram of FIG. 5 that includes a thermoelectric cooler.

FIG. 7 shows the block diagram shown in FIG. 5. However, the energy harvesting fibers 106 are electrically coupled as a thermoelectric cooler 118 for the sensor 114 and the communicator 116. Additionally, the energy harvesting fibers 106 are piezoelectric or thermoelectric fibers that provide an input voltage to the thermoelectric cooler 118 to provide cooling for the sensors 114 and the communicators 116. Thermoelectric fibers are a form of energy harvesting fiber that is characterized by the thermoelectric effect, which uses changes in temperature on an engine component to generate electric voltages. As with piezoelectric materials, the effect is reversible, as in, an applied electric voltage may generate temperature differences. Integrating thermoelectric materials into composite engine components may convert waste heat, generated during engine operation, into electrical energy. Such an embodiment may be applied to engine components 99 located in high temperature environments, such as, but not limited to, the combustion section 26 or the turbine section 28, 30 of the engine 10, where surface temperatures may exceed e.g. 1200 F.

The thermoelectric cooler 118 includes a second energy harvesting fiber 130 and a third energy harvesting fiber 132, each characterized by the thermoelectric effect, and a P-type and N-type semiconductor 131 in serial electrical arrangement between the second and third energy harvesting fibers 130, 132. The second energy harvesting fiber 130 receives an input voltage from the first energy harvesting fiber 106. The third energy harvesting fiber 132 is electrically coupled to output a voltage to the first energy harvesting fiber 106. The P-type and N-type semiconductor 131 includes an alternating arrangement of two dissimilar semiconductors. The P-type semiconductor is characterized by electron holes being the majority carrier of charges while the N-type semiconductor is characterized by electrons being the majority carrier of charges.

The thermoelectric cooler 118 is positioned adjacent to an enclosure 119 that includes the sensor 114 and the communicator 116. A cooled surface 117 of the thermoelectric cooler 118 is adjacent to the enclosure 119 while heat dissipates from a heat sink 120 opposite of the enclosure 119. In another embodiment, several thermoelectric coolers 118 are arranged to enhance heat transfer at the enclosure 119.

The enclosure 119 is a conduit, cap, or frame that generally protects the sensor 114 and communicator 116 from the surrounding environment. For example, the enclosure 119 may be a structure that is thermally resistant to the temperatures near the combustor section 26 or turbine section 28, 30. In another example, the enclosure 119 protects the sensor 114 and communicator 116 from the bypass air 62. In yet another example, the enclosure 119 is a housing for a sensor 114 that is a capacitance probe, of which the capacitance probe may include a capacitor sensor, wiring, and splices. In still another example, the enclosure 119 is a housing for the sensor 114, in which the sensor 114 is a non-interference structural measurement probe, of which the probe may include a laser, wiring, splices, and fluid cooling conduits. The embodiment shown in FIG. 7 advances engine performance by decreasing sensor mortality or enabling sensors 114 to be placed in extreme engine environments, including high temperature, high pressure, or high velocity fluid flows.

Figure 8:
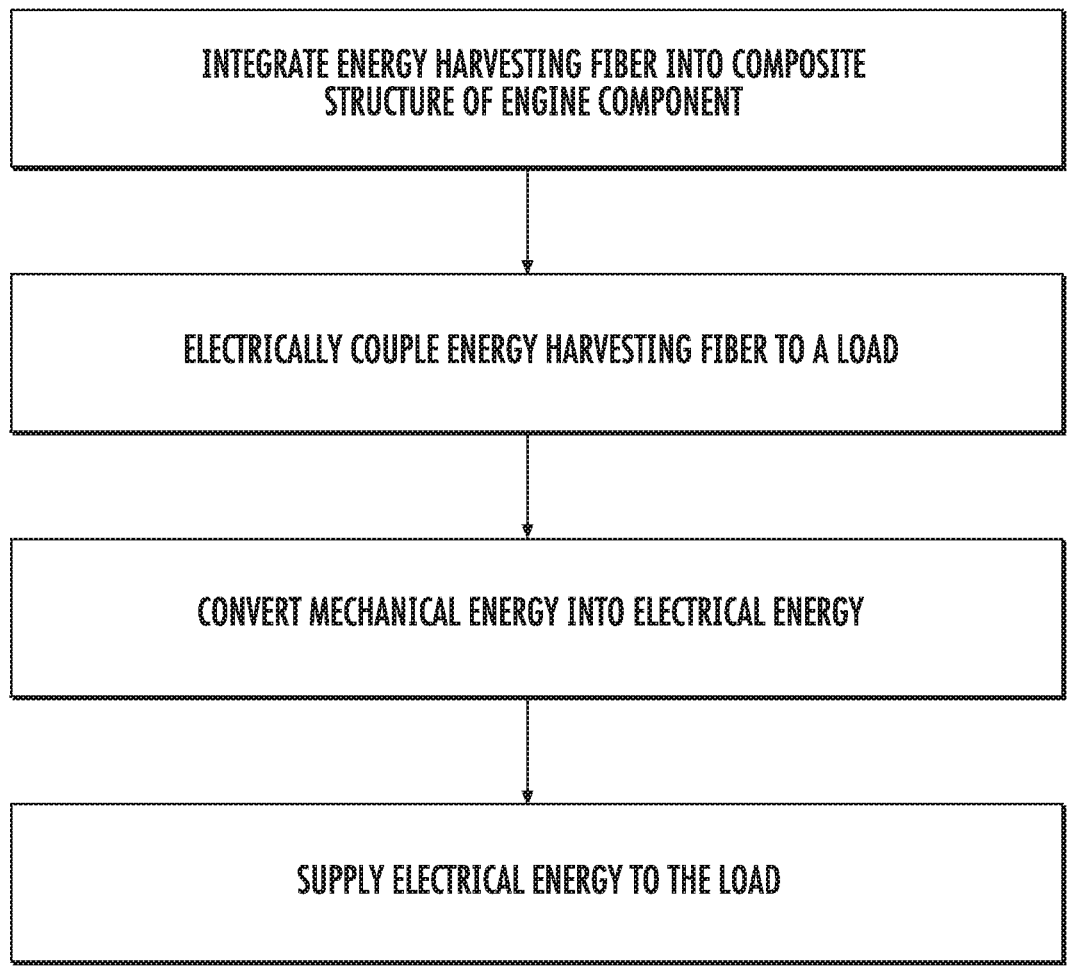
FIG. 8 is a flowchart outlining steps performed by the disclosed method of harvesting energy from an engine component.
Figure 9:
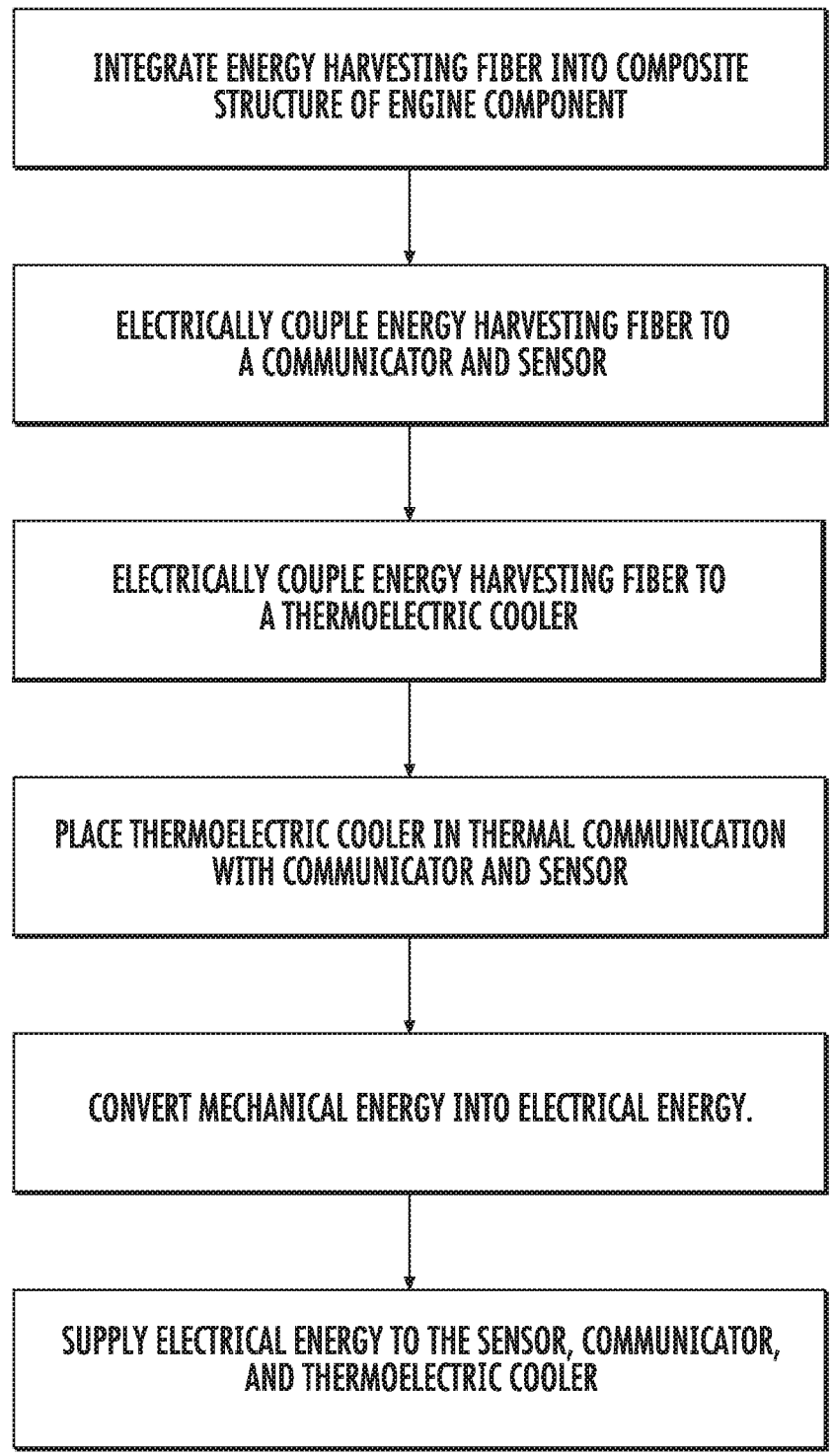
FIG. 9 is a flowchart outlining steps performed by another disclosed method of harvesting energy from an engine component.

As shown in FIG. 8 and FIG. 9, a method of harvesting waste energy from the engine component 99 is outlined. The energy harvesting fiber 106, such as, but not limited to, those characterized by the piezoelectric effect or the thermoelectric effect, is integrated into or onto the substrate 104 that defines the surface 102 of the engine component 99. The energy harvesting fiber 106 includes lead wires 107 that may need a conduit, or trench, or other positioning and retention feature defined in the engine component to facilitate egressing the lead wires to the sensor or communicator. Additionally, the positioning and retention feature may be defined to protect the lead wires 107 as the engine component 99 undergoes further manufacturing after the energy harvesting fiber 106 is placed onto or within the substrate 104 of the engine component 99.

The lead wires 107 of the energy harvesting fiber 106 are electrically coupled to a load 98 that requires an input voltage for operation. The load 98 includes sensors 114 or communicators 116, or both, or other devices that may require an input voltage, such as, but not limited to, a thermoelectric cooler 118, a shunt transducer 108, or other engine 10 and aircraft systems.

In another method, as outlined in FIG. 9, the method of FIG. 8 includes integrating the second energy harvesting fiber 130 and the third energy harvesting fiber 132 that are each characterized by the thermoelectric effect. The second energy harvesting fiber 130 is electrically coupled to receive an input voltage from the first energy harvesting fiber 106, of which is characterized by either the piezoelectric effect or the thermoelectric effect. At least one type of a P-type and N-type semiconductor 131 is in serial electrical arrangement with the second and the third energy harvesting fiber 130, 132. The third energy harvesting fiber 132 is electrically coupled to output a voltage to the first energy harvesting fiber 106. Altogether, the first, second, and third energy harvesting fibers 106, 130, 132 are arranged as the thermoelectric cooler 118.

The thermoelectric cooler 118 is placed in thermal communication with the sensor 114 and the communicator 116 by way of the enclosure 119. The energy harvesting fiber 106 receives mechanical energy, such as forces due to engine operation or foreign or domestic object strikes onto the engine 10, or waste heat from the combustion gases 66 in the engine 10, and converts it to electrical energy that is distributed to the sensor 114 and the communicator 116. When the thermoelectric cooler 118 is electrically coupled to the first energy harvesting fiber 106, mechanical energy is converted to electrical energy to provide electrical current to the second and third energy harvesting fibers 130, 132.

The embodiment in FIG. 10 shows the engine component 99 defining an airfoil 100 with the energy harvesting fiber 106 positioned within the substrate 104 and, configured as a piezoelectric fiber, is electrically coupled to the shunt transducer 108 to form a piezoelectric actuator 109. FIG. 11 shows a cross section of the embodiment in FIG. 8 with the energy harvesting fiber 106 applied in the substrate 104 of the engine component 99. The energy harvesting fiber 106 is electrically coupled to the shunt transducer 108 in the substrate 104 of the engine component 99. As the piezoelectric effect is reversible, meaning that a stress can be applied to the material by way of an applied electric charge, a piezoelectric fiber can be configured as a vibration dampener. The piezoelectric actuator 109 uses an input voltage resulting from a mechanical load 101 on the engine component 99 that incorporates the energy harvesting fiber 106, such as a piezoelectric fiber. When a mechanical load 101 is applied to the engine component 99 and the energy harvesting fiber 106 is subject to the stresses that are induced, a voltage is produced by the energy harvesting fiber 106 and is used as the input voltage to the shunt transducer 108 that includes a network of inductors, capacitors, and resistors tuned to produce an output signal to the energy harvesting fiber 106 that leads to a non-resonant mode.

As a non-limiting example, some aircraft turbofan fan blades 42 must withstand a large bird ingestion test in which a bird impacts a specific area of a fan blade 42 at a speed of about 200 knots, with the fan blades 42 rotating at a speed equivalent to at least about 90% of the maximum rated takeoff power of the turbofan 10 to which the fan blades 42 are installed. A large bird (or equivalent object) generally must impact the leading edge 124 of the fan blade 42 at about the 50% span or greater (measured from a root 121 to a tip 122). While the use of composite materials alone may meet this requirement, composite materials may require airfoils 100 to have a larger maximum thickness 128 than their heavier, metal counterparts. A larger maximum thickness 128 may decrease the speed of air across the suction side 126 of an airfoil 100, which may promote flow separation, pressure oscillations, vibrations, and structural damage to the airfoil 100 and surrounding casings 18. This may result in decreased airfoil 100 structural life, which may lead to failure of the airfoil 100 and the engine 10 or require more frequent maintenance periods. Additionally, a bird ingestion or any foreign or domestic object strike on the engine component 99 may result in an undesired vibratory response in the impacted engine component 99 or another component in the engine 10. This undesired vibratory response may be the result of another engine component failure, or dislodging an engine component from its correct position, or an interruption in the flow of fluids through the engine, including air, fuel or oil. Therefore, to limit the deleterious effect of a foreign or domestic object impact, or any subsequent engine operation issues, and to limit any deleterious effect of using composite airfoils 100, the energy harvesting fiber 106 configured to act as the piezoelectric actuator 109 may be positioned within the substrate 104 of the fan blades 42 or other engine components 99 to a non-resonant mode following a strike or impact to the engine 10.

Additionally, the fan assembly 14 may be mechanically coupled to the LP turbine 30 by way of the LP shaft 36 without a power gearbox 46. As the rotational speed of the LP turbine 30 and the fan assembly 14 may be the same, the larger diameter fan blades 42 may have a large fan blade tip 122 speed. This high fan blade tip 122 speed may create undesired pressure oscillations and vibratory responses, which may lead to structural degradation and fan blade 42 failure over time. Incorporating an energy harvesting fiber 106, such as a piezoelectric fiber, into the substrate 104 of a fan blade 42, and configuring the energy harvesting fiber 106 to a shunt transducer 108 to produce a piezoelectric actuator 109 that functions as a self-tuning piezoelectric vibration dampener, may dampen the fan blades 42 during engine operation.

Figure 12:
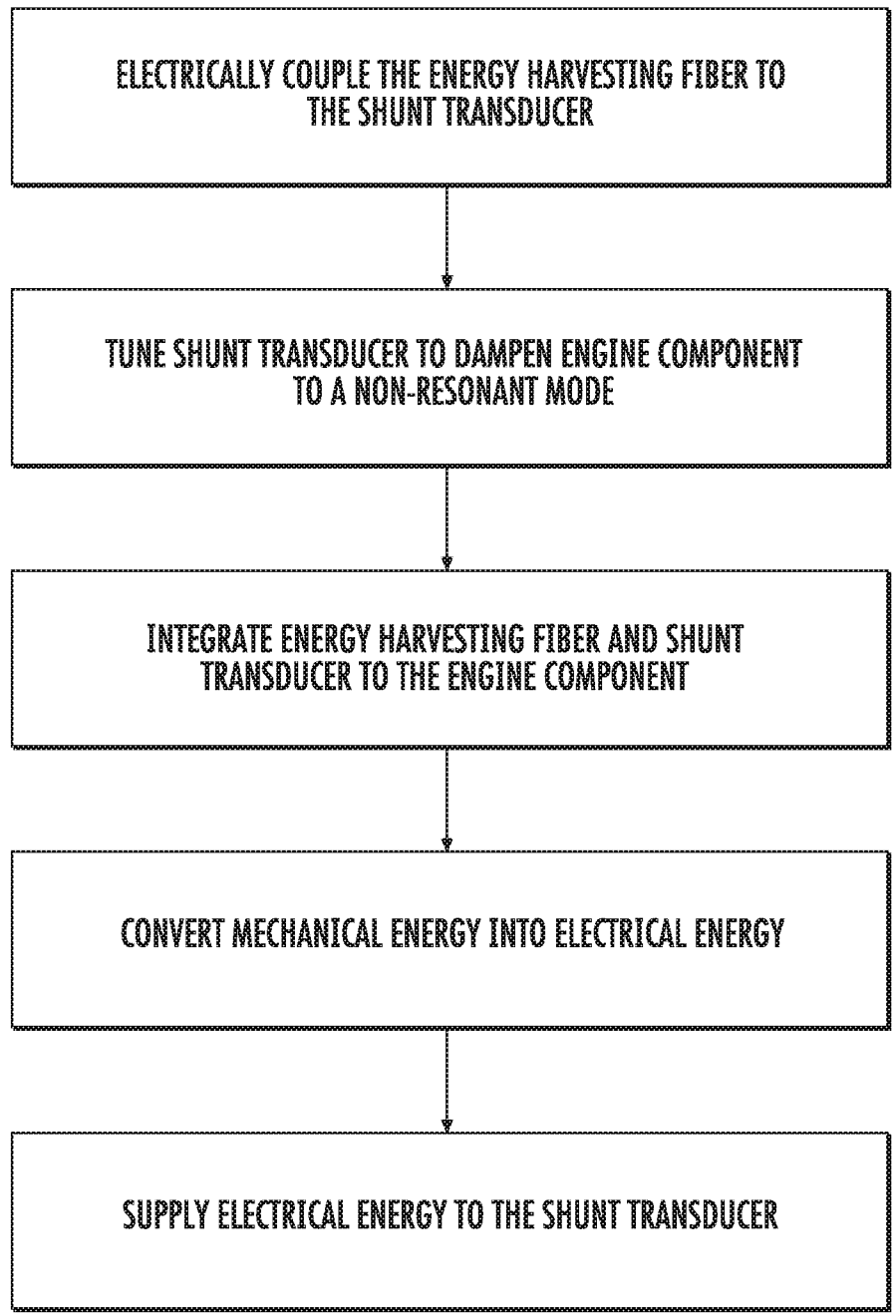
FIG. 12 is a flowchart outlining steps performed by the disclosed method of harvesting energy to absorb vibrations an engine component.

As shown in FIG. 12, a method of harvesting waste energy to absorb vibrations in the engine component 99 is outlined. The energy harvesting fiber 106, configured as a piezoelectric fiber, is electrically coupled to the shunt transducer 108. The shunt transducer 108 may be configured as a vibration absorber by including at least one inductor and capacitor. Including a resistor to the shunt transducer 108 results in a damped vibration absorber. Furthermore, electrically coupling additional energy harvesting fibers 106 configured as piezoelectric fibers located throughout the engine component 99 can enhance the effectiveness of the shunt transducer 108 across multiple vibratory modes. Additionally, energy harvesting fibers 106 configured as piezoelectric fibers distributed throughout several engine components 99, rather than a single engine component 99, may be electrically coupled to enhance the effectiveness of the shunt transducer 108 across multiple vibratory modes for one or several engine components 99.

As modal characteristics of each engine component 99 will be unique to the engine component 99 and its placement within the engine 10, the shunt transducer 108 is tuned to target one or several vibratory modes that the engine component 99 may experience during engine operation. Among the processes to understand the vibratory modes of the engine component 99, and tuning the shunt transducer 108, includes performing a ping test on the engine component 99 to determine its natural frequency. The ping test includes utilizing accelerometers on the engine component 99 and tapping it to produce a response signal. The accelerometers send the response signal to a signal processor, of which the output is a time-dependent frequency response plot. Resonance frequencies of the engine component 99 may appear on the plot, of which can be used as input data for tuning the shunt transducer 108.

The results of the ping test in addition to other data relating to the vibratory modes of interest for the engine component 99 (e.g. data derived from engine testing or other detailed engine component testing), are used to create a mathematical model is to specifically target absorbing and damping the vibratory modes of the engine component 99 to a non-resonant frequency.

The energy harvesting fiber 106 and the shunt transducer 108 are positioned within the substrate 104 of the engine component 99. The substrate 104 may be formed through a number of methods, such as, but not limited to, layers 136 of composite fibers 134 positioned or interleaved upon one another. The energy harvesting fiber 106 and the shunt transducer 108 are layered on or between the layers 136 of composite fibers 134. In other embodiments, the energy harvesting fiber 106 and the shunt transducer 108 are positioned onto the surface 102 defined by the substrate 104 of the engine component 99.

The energy harvesting fiber 106 receives mechanical energy, such as forces due to engine operation or foreign or domestic object strikes onto the engine, and converts it to electrical energy that is distributed through the shunt transducer 108. As the piezoelectric effect is reversible, meaning that an electric current applied to a piezoelectric fiber will cause mechanical deformation, the electrical coupling of one or more energy harvesting fibers 106 to the shunt transducer 108 may result in the piezoelectric fiber altering the engine component 99 to which it is applied such that the vibrations dampened.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An engine component for a gas turbine engine, the engine component comprising:
    an airfoil comprising a substrate defining a surface, wherein the substrate comprises:
    a plurality of layers of composite fibers; and
    an energy harvesting fiber;
    wherein the energy harvesting fiber is positioned between two of the layers of composite fibers.

2. The engine component as in claim 1, wherein at least one layer of the plurality of layers of composite fibers includes the energy harvesting fiber.

3. The engine component as in claim 1, wherein the energy harvesting fiber is a piezoelectric fiber.

4. The engine component as in claim 3, wherein the piezoelectric fiber is a piezoelectric fiber actuator.

5. The engine component as in claim 4, wherein the piezoelectric fiber actuator comprises a shunt transducer.

6. The engine component as in claim 5, wherein the shunt transducer comprises:
    an inductor;
    a capacitor; and
    a resistor, wherein the inductor, the capacitor, and the resistor are configured to dampen one or more vibratory modes of the engine component to a non-resonant mode.

7. The engine component as in claim 1, wherein the energy harvesting fiber is a thermoelectric fiber.

8. The engine component as in claim 7, wherein the thermoelectric fiber is configured as a thermoelectric cooler.

9. The engine component as in claim 1, further comprising a sensor, wherein the sensor is electrically coupled to an energy harvesting fiber.

10. The engine component as in claim 9, further comprising:
    a communicator electrically coupled to receive an input voltage from the energy harvesting fiber and an analog signal from the sensor.

11. The engine component as in claim 10, wherein the communicator comprises:
    a wireless communicator, wherein the wireless communicator is a signal transfer device that operates on the electromagnetic spectrum; and
    a rectifier.

12. The engine component as in claim 10, wherein the communicator comprises a data storage device.

13. A gas turbine engine comprising the engine component of claim 1.

14. The engine component as in claim 1, wherein the substrate further comprises a second energy harvesting fiber located on the surface of the substrate.

15. The engine component as in claim 1, further comprising a sensor, wherein the sensor is electrically coupled to the energy harvesting fiber, the sensor being configured to monitor and communicate engine performance and health.

16. A method of harvesting energy from a gas turbine engine component that comprises an airfoil, the airfoil comprising a substrate defining a surface, the method comprising:
    providing an energy harvesting fiber;
    providing a plurality of layers of composite fibers;
    positioning the energy harvesting fiber between two of the layers of composite fibers;
    electrically coupling the energy harvesting fiber to a load;
    converting mechanical energy into electrical energy; and
    supplying electrical energy to the load.

17. The method of claim 16, further comprising positioning a second energy harvesting fiber on the surface of the substrate.

18. The method of claim 16, further comprising electrically coupling a sensor to the energy harvesting fiber, the sensor being configured to monitor and communicate engine performance and health.

19. The method of claim 16, further comprising
    electrically coupling a sensor to the energy harvesting fiber;
    electrically coupling a communicator to the energy harvesting fiber;
    receiving an input voltage of the energy harvesting fiber from the communicator;
    receiving an analog signal from the sensor.

20. The method of claim 16, wherein the energy harvesting fiber is a piezoelectric fiber.

* * * * *